United States Patent
Tsuchiya et al.

(10) Patent No.: US 7,352,304 B2
(45) Date of Patent: Apr. 1, 2008

(54) INTERPOLATION APPARATUS IN ENCODER

(75) Inventors: Hitoshi Tsuchiya, Hamura (JP); Hiromasa Fujita, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/600,212

(22) Filed: Nov. 16, 2006

(65) Prior Publication Data
US 2007/0146180 A1 Jun. 28, 2007

(30) Foreign Application Priority Data
Dec. 27, 2005 (JP) ............................. 2005-374580

(51) Int. Cl.
*H03M 1/48* (2006.01)
(52) U.S. Cl. ...................... 341/112; 341/111; 341/116; 324/207.12; 324/207.13; 324/207.25
(58) Field of Classification Search ................ 341/111, 341/112, 116
See application file for complete search history.

(56) References Cited

U.S. PATENT DOCUMENTS 5,999,113 A * 12/1999 Kiriyama et al. ........... 341/111
6,188,341 B1 * 2/2001 Taniguchi et al. .......... 341/116
7,015,840 B2 * 3/2006 Takehara .................... 341/116

FOREIGN PATENT DOCUMENTS

JP 2-186221 A 7/1990

* cited by examiner

*Primary Examiner*—Khai M. Nguyen
(74) *Attorney, Agent, or Firm*—Westerman, Hattori, Daniels & Adrian, LLP.

(57) ABSTRACT

An interpolation apparatus in an encoder includes an analog-to-digital converter for digitizing a sine wave signal and a cosine wave signal, respectively. An amplitude level detecting circuit detects each amplitude level of the digitized sine wave signal and cosine wave signal. A computing circuit multiplies the amplitude level of one of the signal by an interpolation position parameter according to a tangent value at an interpolation position. A comparing circuit compares an output from the computing circuit to an output from the amplitude level detecting circuit. The comparison is made at every the interpolation position. A region detecting circuit identifies a region sectionalized by the interpolation positions adjacent to each other based on an output from the comparing circuit corresponding to each the interpolation position. The phase angle of the sine wave signal and the cosine wave signal exists in the region.

5 Claims, 3 Drawing Sheets

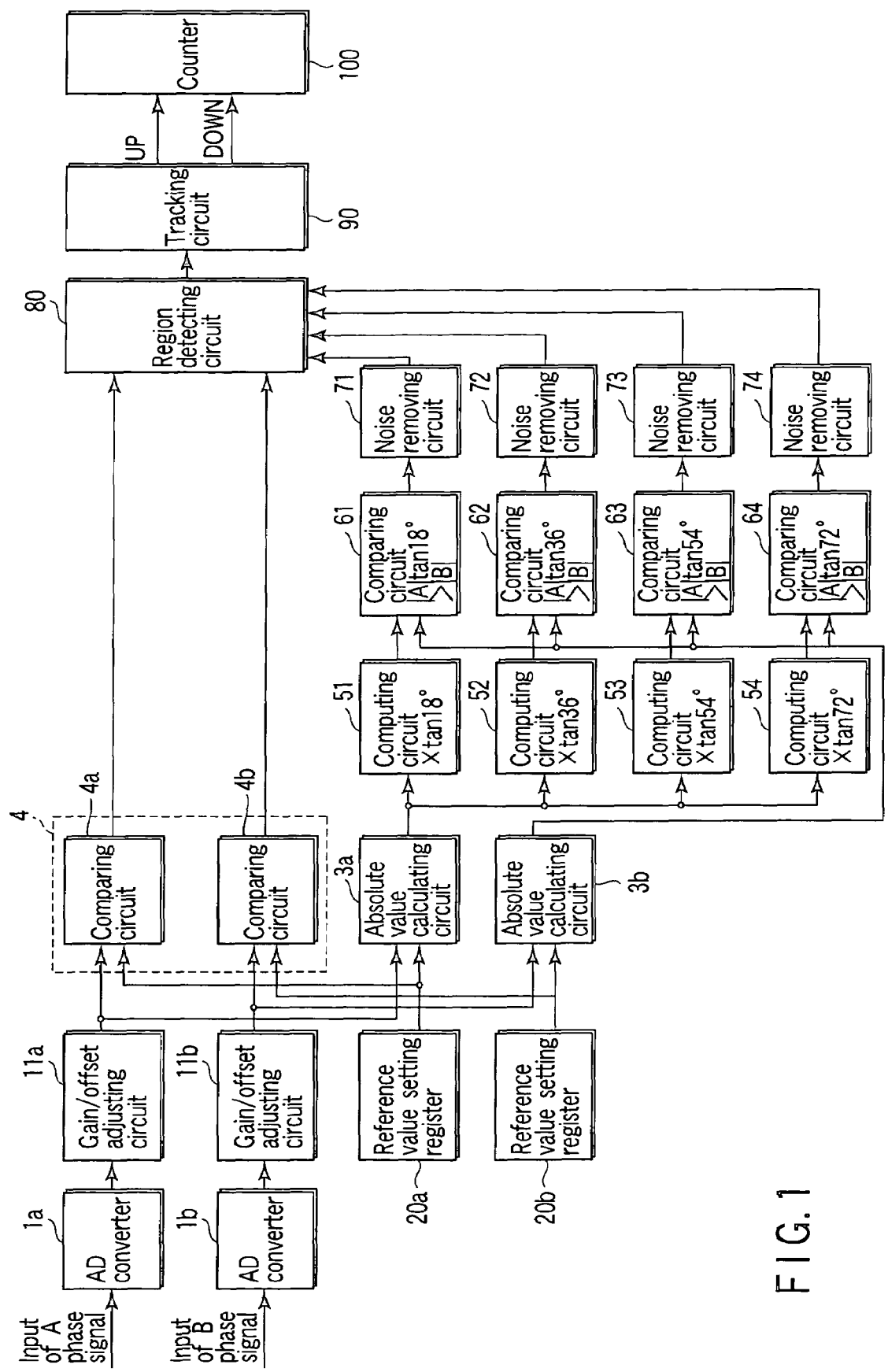
F I G. 1

| State | A | B | $\|A\|\tan18°$ $>\|B\|$ | $\|A\|\tan36°$ $>\|B\|$ | $\|A\|\tan54°$ $>\|B\|$ | $\|A\|\tan72°$ $>\|B\|$ |
|---|---|---|---|---|---|---|
| 1 | 1 | 1 | 0 | 0 | 0 | 0 |
| 2 | 1 | 1 | 0 | 0 | 0 | 1 |
| 3 | 1 | 1 | 0 | 0 | 1 | 1 |
| 4 | 1 | 1 | 0 | 1 | 1 | 1 |
| 5 | 1 | 1 | 1 | 1 | 1 | 1 |
| 6 | 1 | 0 | 1 | 1 | 1 | 1 |
| 7 | 1 | 0 | 0 | 1 | 1 | 1 |
| 8 | 1 | 0 | 0 | 0 | 1 | 1 |
| 9 | 1 | 0 | 0 | 0 | 0 | 1 |
| 10 | 1 | 0 | 0 | 0 | 0 | 0 |
| 11 | 0 | 0 | 0 | 0 | 0 | 0 |
| 12 | 0 | 0 | 0 | 0 | 0 | 1 |
| 13 | 0 | 0 | 0 | 0 | 1 | 1 |
| 14 | 0 | 0 | 0 | 1 | 1 | 1 |
| 15 | 0 | 0 | 1 | 1 | 1 | 1 |
| 16 | 0 | 1 | 1 | 1 | 1 | 1 |
| 17 | 0 | 1 | 0 | 1 | 1 | 1 |
| 18 | 0 | 1 | 0 | 0 | 1 | 1 |
| 19 | 0 | 1 | 0 | 0 | 0 | 1 |
| 20 | 0 | 1 | 0 | 0 | 0 | 0 |

FIG. 4

INTERPOLATION APPARATUS IN ENCODER

CROSS-REFERENCE TO RELATED APPLICATIONS

This application is based upon and claims the benefit of priority from prior Japanese Patent Application No. 2005-374580, filed Dec. 27, 2005, the entire contents of which are incorporated herein by reference.

BACKGROUND OF THE INVENTION

1. Field of the Invention

The present invention relates to an interpolation apparatus in an encoder.

2. Description of the Related Art

There is an apparatus called encoder, which produces a sin θ signal and a cos θ signal whose phases are mutually different by 90° in response to movement of an object to be measured. The encoder then binarizes these produced signals based on a reference value, and counts changes of each binarized signal so as to detect the distance of the object to be measured.

As a method of improving an encoder's resolution, various interpolation methods have been proposed such as, for example, a resistance division method and a phase modulation method. Among these methods, the resistance division method lowers the interpolation precision when the number of divisions increases. The phase modulation method deteriorates the real time performance since time is calculated from a zero cross to a zero cross of a phase modulation wave.

As the first method of solving such a problem, there is a method shown in Jpn. Pat. Appln. KOKAI Publication No. 2-186221, for example. An interpolation apparatus in an encoder shown in the Jpn. Pat. Appln. KOKAI Publication No. 2-186221 incorporates means for digitizing a sine component and a cosine component, means for calculating polar coordinates of a detection signal from the digitized sine and cosine components, and means for dividing one cycle of the detection signal, using the polar coordinates, so as to perform the interpolation. The interpolation apparatus in the encoder converts each of two signals of the sine component and the cosine component into polar coordinates information, and divides one cycle in sine wave based on the angle information so as to perform the interpolation.

Also, as the second method, there is a method shown in Jpn. Pat. Appln. KOKAI Publication No. 2-38814. The method in the Jpn. Pat. Appln. KOKAI Publication No. 2-38814 provides calculating phase angle data corresponding to a sine component and a cosine component in advance, storing the phase angle data in a memory device, and reading out the sine component and the cosine component as address signals from the memory device.

BRIEF SUMMARY OF THE INVENTION

According to a first aspect of the present invention, there is provided an interpolation apparatus in an encoder, including: an analog-to-digital converter which digitizes a sine wave signal and a cosine wave signal, respectively, the sine wave signal and the cosine wave signal being produced in response to position displacement of an object to be measured; an amplitude level detecting circuit which detects each amplitude level of the sine wave signal and the cosine wave signal, which have been digitized; a computing circuit which multiplies the amplitude level of one of the sine wave signal and the cosine wave signal by an interpolation position parameter according to a tangent value at an interpolation position to be set in accordance with the number of interpolations of a phase angle of the sine wave signal and the cosine wave signal; a comparing circuit which compares a first output from the computing circuit for the one of the sine wave signal and the cosine wave signal to a second output from the amplitude level detecting circuit for the other of the sine wave signal and the cosine wave signal, the comparison being made at every the interpolation position; and a region detecting circuit which identifies a region sectionalized by the interpolation positions adjacent to each other based on an output from the comparing circuit corresponding to each the interpolation position, the phase angle of the sine wave signal and the cosine wave signal existing in the region.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing a configuration of an encoder interpolation apparatus according to an embodiment of the present invention.

FIG. 4 is an illustration showing a truth table concerning an operation of a region detecting circuit.

DETAILED DESCRIPTION OF THE INVENTION

Figure 2:
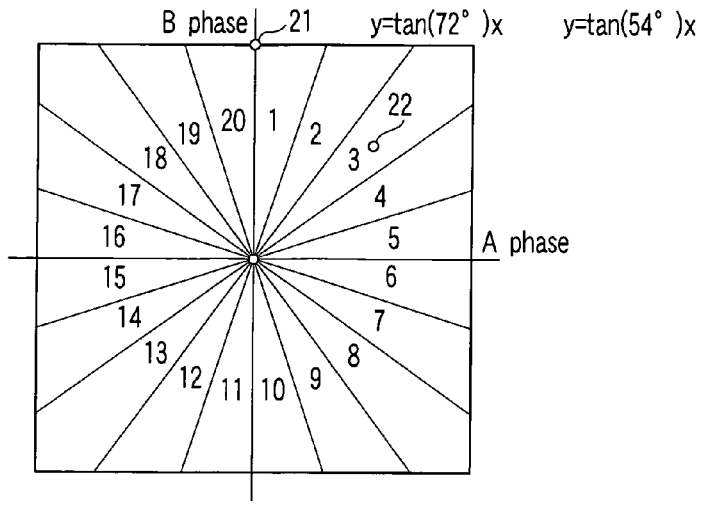
FIG. 2 is an illustration showing a correspondence between an interpolation angle obtained from an A phase signal and a B phase signal, which are input signals, and states in division of one cycle in accordance with the number of interpolations.

Embodiments of the present invention will be explained below with reference to drawings.

FIG. 1 is a block diagram showing a configuration of an encoder interpolation apparatus according to an embodiment of the present invention. Here, the explanation to be described below will be made, taking an example of an encoder interpolation apparatus in which the number of divisions is twenty. However, the number of divisions is not limited to twenty.

The encoder interpolation apparatus shown in FIG. 1 includes analog-to-digital converters 1a and 1b, gain/offset adjusting circuits 11a and 11b, reference value setting registers 20a and 20b, absolute value calculating circuits 3a and 3b, a quadrant determination signal producing circuit 4, computing circuits 51 to 54, comparing circuits 61 to 64, noise removing circuits 71 to 74, a region detecting circuit 80, a tracking circuit 90, and a counter 100.

Here, in FIG. 1, it is omitted to show an encoder head, which produces analog A and B signals made up from a sine wave signal (sing signal) and a cosine wave signal (coso signal) whose phases are mutually different by 90° in correspondence with position displacement of the object to be measured. In the encoder interpolation apparatus to be explained below, a various kind of encoder head can be applied, which can perform conventional well-known optical, magnetic, or electrostatic displacement detection.

The analog-to-digital converter 1a performs a predetermined cycle of sampling of an analog A signal (e.g., a sin θ signal) output from the encoder head (not shown) so as to digitize the analog A signal. The analog-to-digital converter 1b digitizes an analog B signal (e.g., a cos θ signal) output from the encoder head (not shown). Here, a quantization bit rate in the digitization is, for example, eight bits. The gain/offset adjusting circuits 11a and 11b adjust amplitudes and levels of digital data output from the analog-to-digital converters 1a and 1b, respectively.

A reference value for an output of the gain/offset adjusting circuit 11a is set in the reference value setting register 20a. A reference value for an output of the gain/offset adjusting circuit 11b is set in the reference value setting register 20b. The absolute value calculating circuit 3a calculates an absolute value of the difference between the output of the gain/offset adjusting circuit 11a and the reference value set in the reference value setting register 20a. The absolute value calculating circuit 3b calculates an absolute value of the difference between the output of the gain/offset adjusting circuit 11b and the reference value set in the reference value setting register 20b. The absolute value calculating circuits 3a and 3b make up an amplitude level detecting circuit.

The quadrant determination signal producing circuit 4 produces quadrant determination signals for dividing each of the outputs of the gain/offset adjusting circuits 11a and the gain/offset adjusting circuit 11b into four quadrants. The quadrant determination signal producing circuit 4 then outputs the produced quadrant determination signals to the region detecting circuit 80. The quadrant determination signal producing circuit 4 is made up from comparing circuits 4a and 4b. The comparing circuit 4a compares the output of the gain/offset adjusting circuit 11a and the reference value set in the reference value setting register 20a. The comparing circuit 4a then binarizes a result of the comparison so as to produce the quadrant determination signal, and outputs the quadrant determination signal to the region detecting circuit 80. Also, the comparing circuit 4b compares the output of the gain/offset adjusting circuit 11b and the reference value set in the reference value setting register 20b. The comparing circuit 4b then binarizes a result of the comparison so as to produce the quadrant determination signal, and outputs the quadrant determination signal to the region detecting circuit 80.

Each of the computing circuits 51 to 54 outputs as the first output a result of multiplying an output of the absolute value calculating circuit 3a by a tangent value (tang) according to each division phase angle θ. Here, the computing circuit 51 multiplies its input value by a value of tan 18° which has been approximated to a value with a two-bit integer portion and a five-bit decimal portion. The computing circuit 52 multiplies its input value by a value of tan 36° which has been approximated to a value with a two-bit integer portion and a five-bit decimal portion. The computing circuit 53 multiplies its input value by a value of tan 54° which has been approximated to a value with a two-bit integer portion and a five-bit decimal portion. The computing circuit 54 multiplies its input value by a value of tan 72° which has been approximated to a value with a two-bit integer portion and a five-bit decimal portion.

The comparing circuit 61 compares an output of the computing circuit 51 (the first output) to an output of the absolute value calculating circuit 3b (the second output). The comparing circuit 62 compares an output of the computing circuit 52 to an output of the absolute value calculating circuit 3b. The comparing circuit 63 compares an output of the computing circuit 53 to an output of the absolute value calculating circuit 3b. The comparing circuit 64 compares an output of the computing circuit 54 to an output of the absolute value calculating circuit 3b.

The noise removing circuits 71 to 74 remove chattering noise caused by the comparing circuits 61 to 64, respectively. Here, the chattering noise is noise occurring when a noise component of an analog signal input to the encoder interpolation apparatus is mistakenly digitized.

The region detecting circuit 80 detects a region where a phase angle of the A phase signal and the B phase signal exists based on the outputs of the comparing circuits 4a and 4b and the outputs of the noise removing circuits 71 to 74. The tracking circuit 90 limits a region to change to adjacent regions, and produces count-up pulses or count-down pulses to the counter 100. The counter 100 counts the count-up pulses and the count-down pulses output from the tracking circuit 90.

FIG. 2 shows the correspondence between the interpolation angle obtained from the A phase signal (sing signal) and the B phase signal (coso signal), which are input signals, and states in division of one cycle in accordance with the number of interpolations (twenty divisions).

A border between the states shown in FIG. 2 is represented by the relation of y=(tan θ)x. The θ in this formula is 0°, 18°, 36°, 54°, 72°, 90°, 108°, 126°, 144°, or 162°, which is obtained by dividing one cycle of 360° by 20 at 18° intervals.

For example, when the A phase is zero (equal to the reference value) and the B phase is the maximum value, an interpolation angle obtained is 0°. And this interpolation angle, 0°, exists on the border given a reference mark 21 of between a region 1 and a region 20 in FIG. 2. Further, when the A phase and the B phase are equal to each other and are both larger than the reference value, an interpolation angle obtained is 45°. And this interpolation angle, 45°, exists in a region 3 given a reference mark 22 in FIG. 2.

Figure 3:
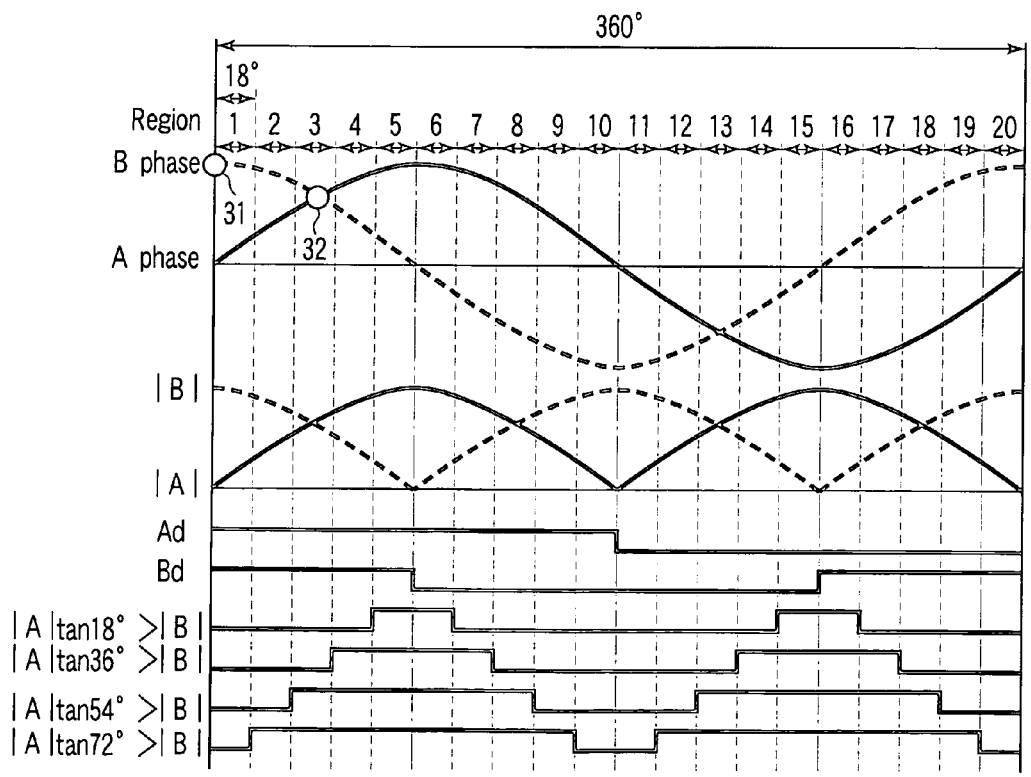
FIG. 3 is an illustration showing a relationship between the A phase signal and the B phase signal, which are input signals, and an output of each circuit.

FIG. 3 shows the relationship between the A phase signal and the B phase signal, which are input signals, and an output of each circuit. Here, numbers shown in the 'Region' of FIG. 3 correspond to the numbers given to the states shown in FIG. 2, and are divided into 20 at 18° intervals of one cycle of a sine component. The 'A phase' and the 'B phase' indicate an analog A phase signal and an analog B phase signal, respectively, which are input from the encoder head. The '|A|' and '|B|' indicate an absolute value of the difference between the A phase signal and the reference value and an absolute value of the difference between the B phase signal and the reference value, respectively, in the event that the reference value set in the reference value setting registers 20a and 20b is 127 or 128. The 'Ad' and 'Bd' show results of binarizing the A phase signal and the B phase signal based on the reference value, respectively. In other words, the 'Ad' and 'Bd' are outputs of the comparing circuits 4a and 4b, respectively. The '|A|tan 18°>|B|', '|A|tan 36°>|B|', '|A|tan 54°>|B|', and '|A|tan 72°>|B|' correspond to outputs of the comparing circuits 61 to 64, respectively. In addition, these are examples of when the reference value is 127 or 128.

In FIG. 3, a point shown with the reference mark 21 in FIG. 2 corresponds to a point shown with a reference mark 31 in FIG. 3. A point shown with the reference mark 22 in FIG. 2 corresponds to a point shown with a reference mark 32 in FIG. 3.

Next, an operation of an interpolation apparatus in an encoder according to the embodiments will be explained.

The analog-to-digital converters 1a and 1b convert to eight-bit digital data a sine component (the analog A phase signal) and a cosine component (the analog B phase signal), respectively, which are produced by the encoder head not shown and are different by 90° in phase. Since each of the components is converted to an eight-bit data byte, each data byte can represent 256 values, from 0 to 255, decimal.

The gain/offset adjusting circuits 11a and 11b integrate predetermined digital data to the digital data converted in the analog-to-digital converters 1a and 1b so as to adjust amplitudes. The gain/offset adjusting circuits 11a and 11b also add predetermined digital data to the digital data converted in the analog-to-digital converters 1a and 1b so as to adjust levels.

The comparing circuits 4a and 4b compare digital data adjusted in the gain/offset adjusting circuits 11a and 11b to the reference values preset in the reference value setting registers 20a and 20b so as to binarize the digital data. The comparing circuits 4a and 4b then output the binarized signals as the quadrant determination signals.

In addition, the outputs of the comparing circuits 4a and 4b are one when a logical formula (Formula 1) below is true and zero when the logical formula is false.

A>ref

B>ref ref: reference value                                            (Formula 1)

The absolute value calculating circuit 3a calculates an absolute value of the difference between the digital data from the analog-to-digital converter 1a and the reference value (e.g., 127 or 128) which has been set in the reference value setting register 20a. The absolute value calculating circuit 3b calculates an absolute value of the difference between the digital data from the analog-to-digital converter 1b and the reference value (e.g., 127 or 128) which has been set in the reference value setting register 20b. In other words, calculations by a formula (Formula 2) below are performed.

|A−ref|

|B−ref|                                                              (Formula 2)

The computing circuits 51 to 54 multiply the absolute value calculated in the absolute value calculating circuit 3a by a value of tan θ.

|A−ref|tan θ                                                         (Formula 3)

Here, the θ is defined as an angle at an interval corresponding to the number of divisions. Since here are twenty divisions, the θ is an angle at an 18° interval. Therefore, the θ is determined as follows: θ=18°, 36°, 54°, or 72°.

Further, the tan θ is approximated to the following values which are expressed, for example, with a two-bit integer portion and a five-bit decimal portion so as to be calculated in a digital circuit.

tan(18°)≅0.3125 (00. 01010b)

tan(36°)≅0.71875 (00. 1011b)

tan(54°)≅1.375 (01. 01100b)

tan(72°)≅3.0625 (11. 00010b)

Here, five bits for a decimal portion are the least number of bits which are necessary for realizing 1° scale detection precision.

In addition, for the θ exceeding 90°, one cycle is divided into four quadrants, using the above-described results of the comparing circuits 4a and 4b. Consequently, the calculation result for 18° can be shared among 162°, 198°, and 342°. The calculation result for 36° can be shared among 144°, 216°, and 324°. The calculation result for 54° can be shared among 126°, 234°, and 306°. The calculation result for 72° can be shared among 108°, 252°, and 288°. Therefore, it is enough to perform the calculation of the formula (Formula 3) only under the above-described four conditions.

The comparing circuits 61 to 64 compare computation results of the computing circuits 51 to 54 to a calculation result of the absolute value calculating circuit 3b, and binarizes the comparison result. Here, since the computation results of the computing circuits 51 to 54 become a fifteen-bit value, the number of bits of eight-bit data output from the absolute value calculating circuit 3b is adjusted in advance of the comparison. Also, the computation results in the comparing circuits 61 to 64 are one when a logical formula (Formula 4) below becomes true and zero when the logical formula becomes false.

|A−ref|tan θ>|B−ref|                                                 (Formula 4)

The noise removing circuits 71 to 74 remove a chattering noise component in the output of the comparing circuits 61 to 64. In the noise removal, each of the noise removing circuits 71 to 74 monitors the level of an input signal for a predetermined period. Each of the noise removing circuits 71 to 74 considers a pulse signal which is shorter than the predetermined period (i.e. a signal changing from "1" to "1" via "0" or from "0" to "0" via "1" sequentially in the predetermined period) to be noise, and continues to output a previous value.

The region detecting circuit 80 uses outputs from the comparing circuits 4a and 4b and output results of the noise removing circuits 71 to 74 which have been noise-removed from the result of the formula (Formula 4). The region detecting circuit 80 determines in which of the twenty division states a phase angle of the A phase signal and the B phase signal positions. Here, the correspondence between the input signal and the state becomes the relationship in the truth table shown in FIG. 4.

The tracking circuit 90 holds previous region information in itself. The tracking circuit 90 compares the previous region information and the output result after the predetermined period from the region detecting circuit 80. When there is the difference between them, the tracking circuit 90 updates the region information held in itself so as to adjust the region information to the output result from the region detecting circuit 80. In this update, the tracking circuit 90 outputs a pulse from 'UP' in FIG. 1 when the transition is made clockwise in the state shown in FIG. 2. The tracking circuit 90 outputs a pulse from 'DOWN' in FIG. 1 when the transition is made counterclockwise. However, the region information held in the tracking circuit 90 can be changed only to its adjacent state. Consequently, when the difference of the states is two or more than two, the internal information is updated in plural times.

Further, whether to change the state clockwise or counterclockwise in the condition shown in FIG. 2 is determined to select a direction in which the number of the regions crossed from the first region to the second region becomes the least when a position (region information of the first region) identified by the region detecting circuit 80 at the previous timing and a position (region information of the second region) identified by the region detecting circuit 80 at the present timing are compared to. One example will be described below.

It presumes that region information is 4, which has been stored in the tracking circuit 90 at the previous timing. Also, it presumes that an output from the region detecting circuit 80 is 18 at the present timing. In this case, as understood from the state illustration shown in FIG. 2, the state information held in the tracking circuit 90 is updated by repeating the transition six times as below.

4→3→2→1→20→19→18

As shown above, by outputting pulse signals so as to make the least updates, it is possible to obtain a correct position of the object to be measured.

The counter 100 counts pulses from the tracking circuit 90. The counter 100 performs addition of count values when a pulse has entered from the 'UP' of the tracking circuit 90. The counter 100 performs subtraction of count values when a pulse has entered from the 'DOWN' of the tracking circuit 90. By reading the count value counted in the counter 100, it is possible to detect the position or a distance of the object to be measured.

As explained above, according to the embodiments, the calculation of the formula (Formula 4) is performed in the comparing circuits 61 to 64 based on the outputs of the computation circuits 51 to 54. Then the region of the interpolation angle position is determined. Consequently, a high-speed computation is enabled without using a memory device such as ROM, RAM, or the like for storing a LUT of trigonometric function values and a processor for a division calculation and a trigonometric function value calculation.

Also, by removing noise in the output of the comparing circuits 61 to 64 in the noise removing circuits 71 to 74, even if input signals of the A phase signal and the B phase signal became steady around the border of the states, the inputs to the tracking circuit 90 do not get to change severely. Therefore, a stable result of the count can be obtained.

In addition, since the tracking circuit 90 updates the state so as to track the detection result of the region detecting circuit 80, the counter 100 can correctly count even if a severe phase change occurred due to an influence of the noise and/or the like on the input signal.

Further, setting the reference values to the reference value setting registers 20a and 20b, it is possible to cope with changes of the signal level by changing the set value.

Still further, according to the embodiments, the comparing circuits 4a and 4b which make up the quadrant determination signal producing circuit 4 divide one cycle of a signal into four quadrants so that calculation results for cases exceeding 90° of the interpolation angle θ can be shared. Consequently, the number of computing circuits can be reduced.

Here, the gain/offset adjusting circuits 11a and 11b, the noise removing circuits 71 to 74, and the tracking circuit 90 may be omitted from the configuration shown in FIG. 1. Also, although the reference value setting registers 20a and 20b are provided for the A phase signal and the B phase signal, respectively, one reference value setting register can be commonly used for the A phase signal and the B phase signal. Also, the reference value setting registers 20a and 20b can alternatively be replaced with digital-to-analog converters. The reference value may be a fixed value.

Also, according to the embodiments, a sine wave signal and a cosine wave signal which are different by 90° in phase are input to the analog-to-digital converters 1a and 1b. However, using three or more than three input signals, further-divided digital signals can be produced.

In addition, according to the embodiments, each input for the A and B phases is assumed to be a single phase. However, by increasing the number of analog-to-digital converters so as to input a two-phase signal to each input for the A and B phases, the tolerance to noise can be improved.

Further, according to the embodiments, the comparing circuits 4a and 4b which make up the quadrant determination signal producing circuit 4 divide one cycle of a signal into four quadrants so that the computing circuits perform computation only on the borders of from 0° to 90°. However, the number of divisions of one cycle is not limited to four quadrants. For example, the computation may be performed on all the border conditions. Also, to divide into eight quadrants enables to improve the precision. In this case, the calculation of the formula (Formula 4) is made on the regions of angles 0° to 45°, 135° to 225°, and 315° to 360° while the following formula (Formula 5) is used to perform the calculation on the regions of angles 45° to 135° and 225° to 315°.

$$|B-ref|\tan\theta > |A-ref| \quad \text{(Formula 5)}$$

Still further, although the tracking circuit 90 has had only diphyletic lines, that is, the 'UP' and 'DOWN', in the above explanation, the counter may perform addition and subtraction using a plurality of bits. Consequently, the calculation precision can expect to be improved since the calculation is performed on a larger amount portion of displacement.

Also, all the processing after the analog-to-digital converters 1a and 1b can be realized by software.

Further, according to the embodiments, the phase difference between the sine wave signal and the cosine wave signal has been 90°, but is not limited to this.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An interpolation apparatus in an encoder, comprising:
   an analog-to-digital converter which digitizes a sine wave signal and a cosine wave signal, respectively, the sine wave signal and the cosine wave signal being produced in response to position displacement of an object to be measured;
   an amplitude level detecting circuit which detects each amplitude level of the sine wave signal and the cosine wave signal, which have been digitized;
   a computing circuit which multiplies the amplitude level of one of the sine wave signal and the cosine wave signal by an interpolation position parameter according to a tangent value at an interpolation position to be set in accordance with the number of interpolations of a phase angle of the sine wave signal and the cosine wave signal;
   a comparing circuit which compares a first output from the computing circuit for the one of the sine wave signal and the cosine wave signal to a second output from the amplitude level detecting circuit for the other of the sine wave signal and the cosine wave signal, the comparison being made at every said interpolation position; and a region detecting circuit which identifies a region sectionalized by the interpolation positions adjacent to each other based on an output from the comparing circuit corresponding to each said interpolation position, the phase angle of the sine wave signal and the cosine wave signal existing in the region.

2. The interpolation apparatus in the encoder according to claim 1, further comprising a noise removing circuit which samples a first output from the comparing circuit at a predetermined cycle so as to remove a signal of a change cycle shorter than the predetermined cycle among the sampled signals.

3. The interpolation apparatus in the encoder according to claim 1, further comprising:
   a tracking circuit which compares region information of a first region identified by the region detecting circuit at a preceding timing to region information of a second region identified by the region detecting circuit at a present timing, and which outputs a count signal corresponding to the number of regions crossed from the first region to the second region, the number of regions becoming the least; and
   a counter which counts the count signal sequentially.

4. The interpolation apparatus in the encoder according to claim 3, wherein the tracking circuit sequentially produces and outputs a count signal corresponding to one region the number of regions times when the tracking circuit outputs the count signal.

5. The interpolation apparatus in the encoder according to claim 1, further comprising a quadrant determination signal producing circuit which compares the digital data of the sine wave signal and the cosine wave signal which have been converted by the analog-to-digital converter to a predetermined reference value, and which outputs a result of the comparison as a quadrant determination signal,
   wherein the region detecting circuit identifies the region based on an output from the quadrant determination signal producing circuit.

* * * * *